(12) United States Patent
Udrea et al.

(10) Patent No.: US 10,551,246 B2
(45) Date of Patent: Feb. 4, 2020

(54) IR DETECTOR ARRAY DEVICE

(71) Applicant: AMS Sensors UK Limited, Cambridge (GB)

(72) Inventors: Florin Udrea, Cambridge (GB); Syed Zeeshan Ali, Cambridge (GB); Richard Henry Hopper, Cambridge (GB); Julian Gardner, Kineton (GB); Andrea De Luca, Cambridge (GB)

(73) Assignee: AMS SENSORS UK LIMITED, Cambridgeshire (GB)

( * ) Notice: Subject to any disclaimer, the term of this patent is extended or adjusted under 35 U.S.C. 154(b) by 911 days.

(21) Appl. No.: 15/009,300

(22) Filed: Jan. 28, 2016

(65) Prior Publication Data
US 2017/0219434 A1 Aug. 3, 2017

(51) Int. Cl.
*G01J 3/42* (2006.01)
*G01J 3/28* (2006.01)
(Continued)

(52) U.S. Cl.
CPC .............. *G01J 3/42* (2013.01); *G01J 3/2803* (2013.01); *H01L 23/34* (2013.01); *H01L 27/1446* (2013.01); *H01L 27/1462* (2013.01); *H01L 27/14607* (2013.01); *H01L 27/14609* (2013.01); *H01L 27/14618* (2013.01); *H01L 27/14625* (2013.01); *H01L 27/14629* (2013.01); *H01L 27/14634* (2013.01); *H01L 27/14636* (2013.01); *H01L 27/14649* (2013.01);
(Continued)

(58) Field of Classification Search
CPC ........... G01J 2005/123; G01J 2005/202; G01J 3/2803; G01J 3/42; G01J 5/024; G01J 5/0853; G01J 5/12; G01J 5/20; H01L 23/34; H01L 27/1446; H01L 27/14607; H01L 27/14609; H01L 27/14618; H01L 27/1462; H01L 27/14625; H01L 27/14629; H01L 27/14634; H01L 27/14636; H01L 27/14649; H01L 27/14669; H01L 27/14683; H01L 27/16; H01L 31/02002; H01L 31/0203; H01L 31/0216; H01L 31/02327; H01L 31/028; H01L 31/16; H01L 31/1804; H01L 37/025

See application file for complete search history.

(56) References Cited

U.S. PATENT DOCUMENTS 4,456,919 A 6/1984 Tomita
7,785,002 B2 8/2010 Dewes et al.
(Continued)

OTHER PUBLICATIONS

Invitation to Pay Additional Fees from corresponding International Application No. PCT/GB2017/050177, dated May 17, 2017.
(Continued)

*Primary Examiner* — Marcus H Taningco
(74) *Attorney, Agent, or Firm* — Tucker Ellis LLP (57) ABSTRACT

We disclose an array of Infra-Red (IR) detectors comprising at least one dielectric membrane formed on a semiconductor substrate comprising an etched portion; at least two IR detectors, and at least one patterned layer formed within or on one or both sides of the said dielectric membrane for controlling the IR absorption of at least one of the IR detectors. The patterned layer comprises laterally spaced structures.

38 Claims, 8 Drawing Sheets

(51) Int. Cl.

| | | |
|---|---|---|
| *H01L 23/34* | (2006.01) | |
| *H01L 27/144* | (2006.01) | |
| *H01L 27/146* | (2006.01) | |
| *H01L 27/16* | (2006.01) | |
| *H01L 31/02* | (2006.01) | |
| *H01L 31/0203* | (2014.01) | |
| *H01L 31/0216* | (2014.01) | |
| *H01L 31/0232* | (2014.01) | |
| *H01L 31/028* | (2006.01) | |
| *H01L 31/16* | (2006.01) | |
| *H01L 31/18* | (2006.01) | |
| *H01L 37/02* | (2006.01) | |

(52) U.S. Cl.
CPC .. *H01L 27/14669* (2013.01); *H01L 27/14683* (2013.01); *H01L 27/16* (2013.01); *H01L 31/02002* (2013.01); *H01L 31/0203* (2013.01); *H01L 31/028* (2013.01); *H01L 31/0216* (2013.01); *H01L 31/02327* (2013.01); *H01L 31/16* (2013.01); *H01L 31/1804* (2013.01); *H01L 37/025* (2013.01)

(56) References Cited

U.S. PATENT DOCUMENTS

| | | | |
|---|---|---|---|
| 8,552,380 B1* | 10/2013 | Florin | G01J 5/12 250/338.4 |
| 2012/0267532 A1 | 10/2012 | Udrea | |
| 2014/0124671 A1* | 5/2014 | Herrmann | G01J 5/10 250/340 |
| 2014/0291704 A1 | 10/2014 | Ali | |
| 2015/0035110 A1 | 2/2015 | Pisano | |
| 2017/0343419 A1* | 11/2017 | Hopper | H01L 35/32 |

OTHER PUBLICATIONS

Lahiji, G.R. et al., "A Batch-Fabricated Silicon Thermopile Infrared Detector", IEEE Transactions on Electron Devices, vol. ED-29, No. 1, Jan. 1982, pp. 14-22.

Allison, S.C. et al., "A bulk micromachined silicon thermopile with high sensitivity", Sensors and Actuators A 104, Apr. 1, 2002, pp. 32-39.

Kim, Jae-Kwan et al., "A new uncooled thermal infrared detector using silicon diode", Sensors and Actuators A 89, 2001, pp. 22-27.

Shklover, Valery, et al., "High Temperature Photonic Structures. Thermal Barrier Coatings, Infrared Sources and Other Applications", Journal of Computational and Theoretical Nanoscience, vol. 5, pp. 1-32, (2008), American Scientific Publishers, U.S.A.

Eminoglu, Selim, et al., "Low-cost uncooled infrared detectors in CMOS process", Sensors and Actuators A 109, (2003), pp. 102-113.

Fujisawa, Daisuke, et al., "Multi-color imaging with silicon-on-insulator diode uncooled infrared focal plane array using through-hole plasmonic metamaterial absorbers", IEEE, MEMS 2015, Estoril Portugal, Jan. 18-22, 2015, pp. 905-908.

Masuda, Kyohei, et al., "Optimization of Two-Dimensional Plasmonic Absorbers Based on a Metamaterial and Cylindrical Cavity Model Approach for High-Responsivity Wavelength-Selective Uncooled Infrared Sensors", Sensors and Materials, vol. 26, No. 4 (2014) pp. 215-233, MYU Tokyo.

Schneeberger, N., et al., "Optimized CMOS Infrared Detector Microsystems", IEEE (1995), pp. 198-201.

Graf, A., et al., "Review of micromachined thermopiles for infrared detection", IOP Publishing, Measurement Science and Technology 18, (2007), pp. R59-R75.

Lenggenhager, Rene, et al., "Thermoelectric Infrared Sensors by CMOS Technology", IEEE Electron Device Letters, vol. 13, No. 9, Sep. 1992.

Nieveld, Gert, "Thermopiles Fabricated using Silicon Planar Technology", Sensors and Actuators 3 (1982/83), pp. 179-183, Oct. 12, 2982.

Ogawa, Shinpei, et al., "Wavelength selective wideband uncooled infrared sensor using a two-dimensional plasmonic absorber", Optical Engineering 52(12), Dec. 2013, pp. 127104-1 to 127104-5.

\* cited by examiner

IR DETECTOR ARRAY DEVICE

FIELD OF THE INVENTION

This invention relates to Infra-Red (IR) plasmonic devices for spectroscopic gas sensing applications. Particularly but not exclusively, the invention relates to an IR plasmonic array of detectors with tailored optical properties.

BACKGROUND OF THE INVENTION

It is known to fabricate thermal IR detectors on a silicon substrate comprising a thin membrane layer (made of electrically insulating layers) that is formed by etching of part of the substrate. Incident IR radiation increases the temperature of the membrane—which can be measured by either a thermopile, a resistor, or a diode.

For Example, Schneeberger et al "Optimized CMOS Infrared Detector Microsystems," Proc IEEE Tencon 1995, reports fabrication of CMOS IR detectors based on thermopiles. The thermopile comprises several thermocouples connected in series. KOH is used to etch the membrane and improve the thermal isolation. Each thermocouple comprises 2 strips of different materials, connected electrically and forming a thermal junction at one end (termed hot junction) while the other ends of the material are electrically connected to other thermocouples in series forming a thermal cold junction. The hot junctions of the thermocouples are on the membrane, while the cold junction is outside the membrane. Three different designs of the thermocouples are given in the paper with different material compositions: Aluminium and p-doped polysilicon, Aluminium and n-doped Polysilicon, or p-doped polysilicon and n-doped polysilicon. Incident IR radiation causes a slight increase in temperature of the membrane. The Seebeck effect causes a slight voltage difference across each thermocouple—resulting in a much large increase in voltage difference across the thermopile which is the sum of the voltages across each thermocouple.

Previously, Nieveld "Thermopiles Fabricated using Silicon Planar Technology," Sensors and Actuators 3 (1982/83) 179-183, showed the fabrication of a thermopile on a micro-chip based on aluminium and single crystal silicon P+ as the materials in the thermocouple. It should be noted that this was a general thermopile device—not intended for IR detection and the thermopile was not on a membrane.

Allison et al., "A bulk micromachined silicon thermopile with high sensitivity," Sensors and Actuators A 104 2003 32-39, describes a thermopile based on single crystal silicon P-doped and N-doped materials. However, these are formed by wafer bonding of a P-type wafer and an N-type wafer and is also not specifically for use as an IR detector. The fabrication method is also very expensive.

Lahiji et al., "A Batch-fabricated Silicon Thermopile Infrared Detector," IEEE Transactions on Electron Devices" 1992, describe two thermopile IR detectors, one based on Bismuth-antimony thermocouples, and the other based on polysilicon and gold thermocouples.

U.S. Pat. No. 7,785,002 describes an IR detector with a thermopile based on P and N doped polysilicon. Langgenhager et al. "Thermoelectric Infrared Sensors by CMOS Technology," IEEE EDL 1992, describes IR detectors comprising thermopiles on a suspended structure comprising aluminium and polysilicon.

Several other Thermopile devices are described by Graf et al. "Review of micromachined thermopiles for infrared detection," Meas. Sci. Technol. 2007.

Another method of measuring the IR radiation is by the use of thermodiodes. For example, Kim and Chan "A new uncooled thermal infrared detector using silicon diode," S&A A 89, 2001, describe a diode fabricated by micromachining for use as an IR detector.

Eminoglu et al. "Low-cost uncooled infrared detectors in CMOS process," S&A A 109 (2003), describes IR detectors made using a CMOS process with diodes on a suspended membrane.

Similarly thermodiode based IR detectors may also be made using an SOI process. However, thermodiodes have the disadvantage that they need a biased voltage or current—which requires power. In addition, it has a high base voltage, which makes it harder to measure small changes in the output voltage.

There have been several reports in literature that suggest that the emissivity/absorptivity of devices can be varied at particular wavelengths by using plasmonic structures, which are periodic structures created on a surface. For example these are described in Shklover et al., "High-Temperature Photonic Structures, Thermal Barrier Coatings, Infrared Sources and Other Applications," Journal of Computational and Theoretical Nanoscience, Vol 5, 2008, pp. 862-893.

Masuda et al., "Optimization of two-dimensional plasmonic absorbers based on a metamaterial and cylindrical cavity model approach for high-responsivity wavelength-selective uncooled infrared sensors," Sens. Mater, vol. 26, pp. 215-223, 2014 propose a CMOS thermopile IR detector using a Cr/Au plasmonic absorbing layer for spectral selectivity. However for enhanced thermal isolation of the active area, this latter is physically connected to the substrate only via thin beams. This arrangement not only affects the mechanical robustness of the device, but also poses a limit on the maximum number of thermocouples that can be integrated in the device, thus limiting the overall thermo-electrical conversion efficiency. In Ogawa et al., "Wavelength selective wideband uncooled infrared sensor using a two-dimensional plasmonic absorber," Optical Engineering, vol. 52, pp. 127104-127104, 2013 also an array of such thermopiles, each having a different plasmonic structure is studied for multicolor IR imaging applications.

A silicon-on-insulator diode uncooled IR focal plane array with through hole plasmonic absorber is reported by Fujisawa et al., "Multi-color imaging with silicon-on-insulator diode uncooled infrared focal plane array using through-hole plasmonic metamaterial absorbers," in Micro Electro Mechanical Systems (MEMS), 2015 28th IEEE International Conference on, 2015, pp. 905-908. Like for the previous example, through holes are believed to compromise the device mechanical robustness.

In US20150035110A1 by Pisano et al. a MEMS pyroelectric AlN IR detector is reported, where wavelength selectivity is achieved by patterning of the top electrode to form a plasmonic structure. One drawback of pyroelectric detectors in comparison to thermopiles, diodes and bolometers is that they are only sensitive to changes in illumination.

US 20140291704 A1 by Ali et al. describes an Infrared device which can be configured as either an emitter or a source with plasmonic structures placed within the membrane to increase the emission or absorption at a particular wavelength. The patent does not cover the idea of an array of detectors with different patterns of plasmonic structures, nor it covers any differential (or processing) method or transducing technique to analyse the response of several IR detectors having different plasmonic structures and/or compare them to a structure that does not feature a plasmonic pattern.

SUMMARY

According to one aspect of the present invention there is provided an infra-red (IR) detector array device comprising: at least one dielectric membrane formed on a semiconductor substrate comprising an etched portion; an array of IR detectors comprising at least two IR detectors, wherein said array of IR detectors are formed on or within said at least one dielectric membrane; and at least one patterned layer formed within or on said dielectric membrane for controlling the IR absorption of at least one of the said IR detectors, and wherein said at least one patterned layer comprises laterally spaced structures.

There is also provided an array of Infra-Red (IR) detectors comprising: at least one dielectric membrane formed on a semiconductor substrate comprising an etched portion; at least two IR detectors, and at least one patterned layer formed within or on one or both sides of the said dielectric membrane for controlling the IR absorption of at least one of the said IR detectors, wherein the said patterned layer comprises laterally spaced structures.

The IR detector may be a diode, a resistor or a thermopile or a combination of those.

In the example of a thermopile, it comprises one or more thermocouples connected in series. Each thermocouple comprises two dissimilar materials which form a junction within the membrane while the other ends of the materials are at the edge of the membrane or outside the membrane where they are connected electrically to the adjacent thermocouple to form the cold junction.

The thermocouple materials may comprise metal such as Aluminium, Copper, Nickel, Tungsten, Titanium or combination of those, doped polysilicon (n or p type) or doped single crystal silicon (n or p type). In the example that both the materials are polysilicon and/or single crystal silicon, a metal link might be used to form the junctions between them.

In the example of using diode detectors, one or several diodes may be connected in series in the centre or in the proximity of the centre of the membrane. The diode may be made of polysilicon or of single crystal silicon. Reference diodes that measure the substrate/case/ambient temperature may be placed outside the membrane area. The reference diode may act as a reference temperature sensor if the IR detector is made of thermopile or resistor.

In the example of using a resistor, the resistor can be placed in the centre or in the proximity of the centre of the membrane. The resistor may be made of metal such as Aluminium, Copper, Tungsten, Platinum, or polysilicon (n or p type) or single crystal silicon (n or p type). The resistance of such resistors will change with a change in temperature. A reference resistor that measures the substrate/case/ambient temperature may be placed outside the membrane area. The reference resistor may act as a reference temperature sensor if the IR detector is made of thermopile or diode.

Alternately, the IR detection may be done by a combination of different sensor types. For example, a thermopile, where both the Seebeck effect and the resistance change effect are used to determine the IR radiation. Alternatively for example the thermopile may use a reference diode for the cold temperature in order to determine the absolute temperature in the hot junction.

The plasmonic patterned layer may be made of metal such as tungsten, aluminium, titanium, molybdenum, gold or platinum, silicides or polysilicon or single crystal silicon, and are periodically repeated in a lateral direction. The pattern may be made of circles, ellipses, rectangular structures, trapezoidal structures, or any other shape. The repeat pattern may be hexagonal or square. The structures may be in more than one layer. The plasmonic patterned layer can either be dots of shapes periodically repeated, or can be holes of shapes repeated within the layer structure.

The patterned plasmonic layer may be identical in all the IR devices within the array. Alternately, the patterned plasmonic layer or layers may be different on each device, or may be the same across some devices, but different across others. The array may also have some devices with the patterned plasmonic layer or layers and some without any patterned plasmonic layer.

The dielectric membrane may comprise silicon dioxide and/or silicon nitride. The entire array of IR detectors may be on a single membrane, or the array may comprise several membranes with one IR detector on each membrane, or the array may comprise several membranes, with each membrane having several IR detectors. The membrane or membranes may also have other structures made of polysilicon, single crystal silicon or metal to separate the IR detectors. These structures may be embedded within the membrane, or maybe above or below the membrane.

The membrane or membranes may be formed by back-etching using Deep Reactive Ion Etching (DRIE) of the substrate, which results in vertical sidewalls. The back-etching may also be done by using anisotropic etching such as KOH (Potassium Hydroxide) or TMAH (Tetra Methyl Ammonium Hydroxide) which results in slopping sidewalls. The membrane may also be formed by a front-side etch or a combination of a front-side and back-side etch to result in a suspended membrane structure, supported only by 2 or more beams. The membrane may be circular, rectangular, or rectangular shaped with rounded corners to reduce the stresses in the corners, but other shapes are possible as well.

The IR plasmonic array may be preferably made using a CMOS or CMOS-compatible process. Circuitry may be integrated on the same chip with said IR detector array. The circuitry may comprise switches, multiplexers, decoder, analogue or digital filters, amplifiers, analogue to digital converters and digital processors. The circuitry will typically be outside the membrane area. The circuitry may include drive circuitry for the IR detector, a temperature sensor for ambient temperature monitoring and compensation, the driving and readout circuitry for said temperature sensor, and readout circuitry for the IR detectors. Furthermore the circuitry may comprise dedicated analogue blocks to enhance spectral selectivity, by processing the outputs from each individual detector within the IR detector array according to the embodiment of the invention. For example a differential or instrumentation amplifier may be used to determine the differential signal between two detectors to extract the difference in spectral response. For example, if two detectors have identical responses across the IR spectrum, except that one has a high peak at one waveband, then a differential or instrumentation amplifier may be used to extract the signal at only this waveband. Alternatively digital interfacing and processing may be integrated on-chip or in the same package to allow a higher degree of processing and spectral selectivity.

Alternatively the IR detector array may also be fabricated with some or all non-CMOS materials. The metals used may comprise platinum or gold. The IR detecting materials and plasmonic layers may comprise other materials such as vanadium oxide, or various silicides, including magnesium silicide.

The starting substrate may be silicon, or silicon on insulator (SOI) or any semiconductor, besides silicon, such as Silicon Carbide, Gallium Arsenide or Gallium nitride or a combination of those together with silicon.

The device maybe packaged in a metal TO type package. The device may also be packaged in a ceramic, metal or plastic SMD (surface mount device) package. The package may have one or more IR filters or windows, or a filter whose characteristics vary spatially. The package maybe hermetically or semi-hermetically sealed with air, dry air, argon, nitrogen, xenon or any other noble gas. The device may also be packaged in a vacuum. The device may also be packaged with a lens or a reflector. The package may also be a chip or wafer level package, formed for example, by wafer-bonding an etched wafer/chip on top, with the etched wafer/chip having a portion that is transparent to at least some wavelengths of IR. The device may also be packaged directly on a PCB, or be packaged in a flip-chip method.

The device may also have an IR emitter fabricated on the same chip. The IR emitter may be on a separate membrane, and may comprise a heater made of tungsten, aluminium, polysilicon, single crystal silicon, titanium, platinum, or gold. The IR emitter may also have one or more plasmonic patterned layer within or on one side of the membrane.

In another embodiment of the invention, there is provided an NDIR sensor/system, or an IR spectroscopic sensor/system employing an array of Infra-Red (IR) detectors comprising: at least one dielectric membrane formed on a semiconductor substrate comprising an etched portion; at least two IR detectors, and at least one patterned layer formed within or on one or both sides of the said dielectric membrane for controlling the IR absorption of at least one of the said IR detectors, wherein the said patterned layer comprises laterally spaced structures.

The sensor/system may have one or more IR filters. Alternately, and advantageously, the system may not employ an optical filter (or employing a less accurate, and cheaper optical filter) and therefore being advantageous from a cost point of view, higher signal to noise ratio and less dependence on ambient or case temperature. Furthermore, in the example of eliminating the need for an optical filter, a reduction of the form factor of the NDIR sensor may be achieved as well as a simplification of the overall NDIR sensor assembly process.

According to the embodiments of the invention, the array may comprise two IR detectors on the same membrane or on different membranes whereby one of the IR detectors may feature no plasmonic patterned layer while the other may feature a plasmonic patterned layer that may enhance a particular wavelength or a range or band of wavelengths. By subtracting the output signal of one of the IR detectors from the other or by using other methods of processing the two output signals, undesirable wavelengths or bands of wavelengths may be removed, alleviating the need for a complex and/or accurate optical filter or completely removing the need for an optical filter, when the detector is used in systems such as an NDIR sensor.

According to the embodiments of the invention, the array may comprise two IR detectors on the same membrane or on different membranes whereby one of the IR detectors features a plasmonic patterned layer that may enhance a particular wavelength or a range or band of wavelengths while the other may feature a different plasmonic patterned layer that may enhance a different wavelength or a different range or band of wavelengths. By subtracting the output signal of one of the IR detectors from the other or by using other methods of processing the two output signals, undesirable wavelengths or bands of wavelengths may be removed, alleviating the need for a complex and/or accurate optical filter or completely removing the need for an optical filter, when the detector is used in systems such as an NDIR sensor.

According to the embodiments of the invention, the array may comprise several IR detectors (more than two) on the same membrane or on different membranes with different plasmonic patterned layers and/or one with no plasmonic patterned layer. By smart processing of the output signals, information regarding at what wavelength IR absorption takes place may be extracted thus providing a mean for spectroscopic selectivity.

For example this technique may be used to selectively identify the gas and extract its concentration in an NDIR sensor/system alleviating the need for a complex and/or accurate optical filter or completely removing the need for an optical filter. Alternatively, in a NDIR sensor/system, each gas present, at different concentration will have a different overall signature given by the combined outputs from each of the detector within the detector array according to the embodiment of the invention. By grouping and processing the data from each detector, information regarding the gas nature (and/or its composition in the case of a mixture of gases) and its concentration may be extracted.

Embodiments of the invention may also be extended to other applications to detect emission from other sources of IR, for example, that from human body or flames.

The array of IR detectors, or the NDIR/Spectroscopic system may be used in portable electronic devices, buildings or in automobiles. Some or all of the signal processing may be performed by the circuitry on-chip, or on a chip co-packaged with the detector, or a chip on the same PCB, or within the device, or maybe processed at a remote device or system.

According to a further aspect of the present invention there is provided a method of manufacturing an infra-red (IR) detector array device, the method comprising:
    forming a semiconductor substrate;
    depositing one or more layers of polysilicon and/or metals and dielectric layers to form an array of IR detectors and at least one patterned layer;
    bulk etching the semiconductor substrate to form one or more dielectric membranes;
    wherein said at least one patterned layer is formed within or on said dielectric membrane for controlling the IR absorption of at least one of the said IR detectors, and wherein said at least one patterned layer comprises laterally spaced structures.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
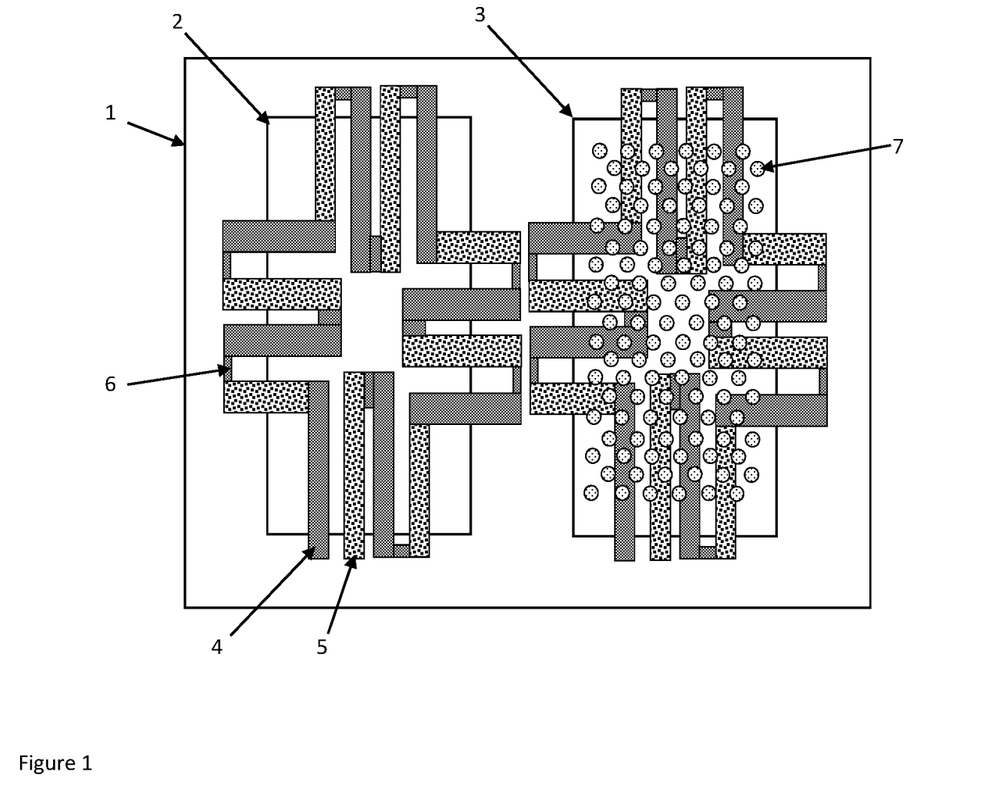
FIG. 1 shows a schematic top view of a double thermopile IR detector chip, with one IR detector having a patterned layer for controlling the IR absorption.

FIG. 1 shows a schematic top-view of a double thermopile IR detector chip 1, with two membranes 2 and 3. The membranes are dielectric membranes and may comprise one or more layers of silicon dioxide and/or silicon nitride. A thermopile, comprising one or more thermocouples connected in series, is embedded within each membrane to form two distinct thermopile IR detectors. Each thermocouple comprises of two dissimilar materials 4 and 5 which form a junction within the membrane while the other ends of the materials are outside the membrane where they are connected electrically to the adjacent thermocouple to form the cold junction. The thermocouple materials may comprise metal such as Aluminium, Tungsten, Titanium or combination of those, doped polysilicon (n or p type) or doped single crystal silicon (n or p type). In the example that both the materials are polysilicon and/or single crystal silicon, a metal link 6 might be used to form the junctions between them. A plasmonic patterned layer 7 is also embedded within membrane 3, to provide the thermopile IR detector with tailored optical properties. The plasmonic patterned layer may be made of metal such as tungsten, aluminium, titanium, molybdenum, gold or platinum, silicides or polysilicon or single crystal silicon, and are periodically repeated in a lateral direction. The pattern may be made of dots or holes of circles, ellipses, rectangular structures, trapezoidal structures, or any other shape. The repeat pattern may be hexagonal or square. The structures may be in more than one layer, within or on the top surface of the membrane.

Figure 2:
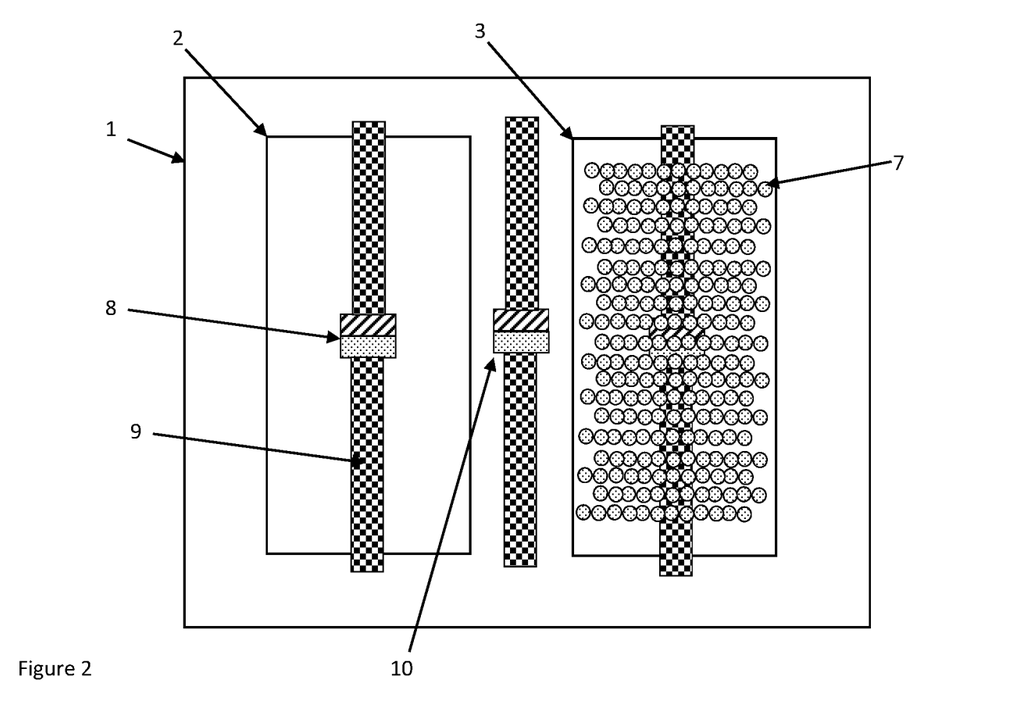
FIG. 2 shows a schematic top view of a double diode IR detector chip, with one IR detector having a patterned layer for controlling the IR absorption. A reference diode that measure the substrate/case/ambient temperature is also placed outside the membrane areas.

FIG. 2 shows a schematic top-view of a double diode IR detector chip 1, with two membranes 2 and 3. The membranes are dielectric membranes and may comprise one or more layers of silicon dioxide and/or silicon nitride. A diode 8, and tracks 9, is embedded within each membrane to form to distinct diode IR detectors. The diodes may be made of polysilicon or of single crystal silicon. One or several diodes for enhanced sensitivity may be connected in series in the centre or in the proximity of the centre of the membrane. A plasmonic patterned layer 7 is also embedded within membrane 3, to provide the diode IR detector with tailored optical properties. The plasmonic patterned layer may be made of metal such as tungsten, aluminium, titanium, molybdenum, gold or platinum, silicides or polysilicon or single crystal silicon. The pattern may be made of circles, ellipses, rectangular structures, trapezoidal structures, or any other shape periodically repeated in a lateral direction. The repeat pattern may be hexagonal or square. The structures may be in more than one layer within or on the top surface of the membrane. A reference diode 10 that measures the substrate/case/ambient temperature is also placed outside the membrane areas.

Figure 3:
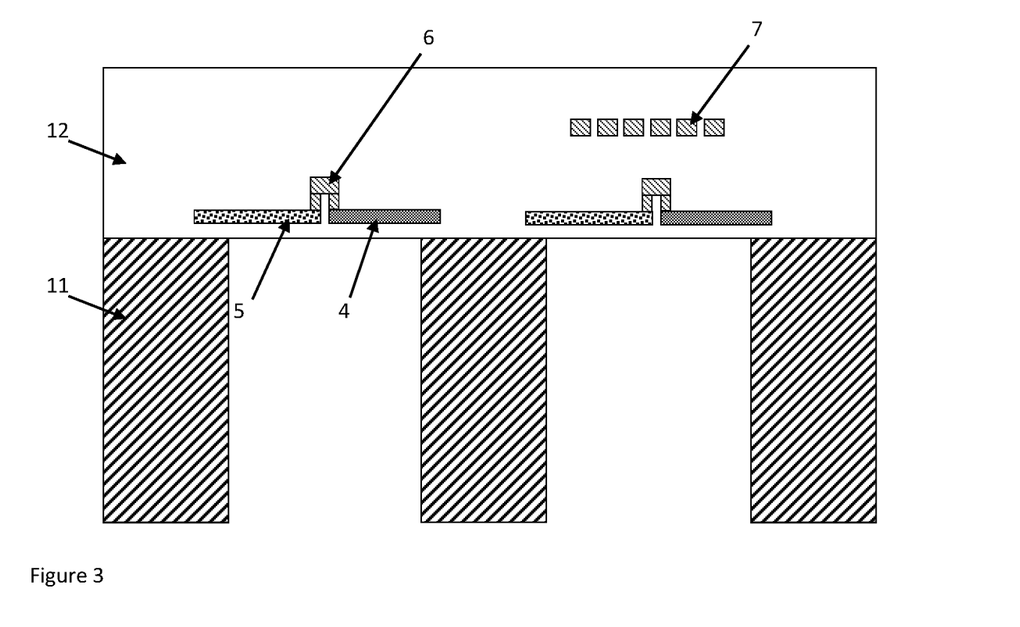
FIG. 3 shows the schematic cross-section of the double thermopile IR detector chip shown in FIG. 1.

FIG. 3 shows the schematic cross-section of the double thermopile IR detector chip shown in FIG. 1. The membranes 2 and 3 are supported on an etched substrate 11, and comprise dielectric layers 12 and may comprise one or more layers of silicon dioxide and/or silicon nitride. The thermopiles comprise p-doped silicon 4, and n-doped silicon 5, and a metal 6 is used to form a junction between them. The thermopile materials may comprise many other configurations, for example, n-doped silicon and metal, or p-doped silicon and metal. The silicon for the thermopiles may be polysilicon or single crystal silicon. A plasmonic patterned layer 7 is also embedded within membrane 3, to provide the thermopile IR detector with tailored optical properties. The substrate in this example is etched by Deep Reactive Ion Etching (DRIE) which results in vertical sidewalls.

Figure 4:
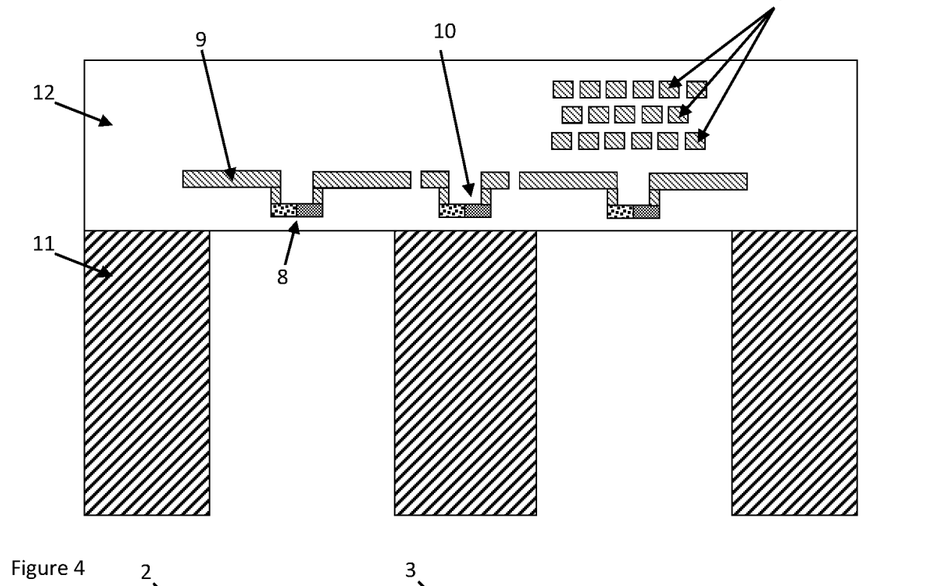
FIG. 4 shows the schematic cross-section of the double diode IR detector chip shown in FIG. 2.

FIG. 4 shows the schematic cross-section of the double diode IR detector chip shown in FIG. 2. The membranes 2 and 3 are supported on an etched substrate 11, and comprise dielectric layers 12 and may comprise one or more layers of silicon dioxide and/or silicon nitride. The diodes 8 are made of single crystal silicon and contacted via metal tracks 9. Alternatively the diodes may be made of polysilicon. A plasmonic patterned layer 7, made of multiple metal layers, is also embedded within membrane 3, to provide the diode IR detector with tailored optical properties. A reference diode 10 that measures the substrate/case/ambient temperature is also placed outside the membrane areas.

Figure 5:
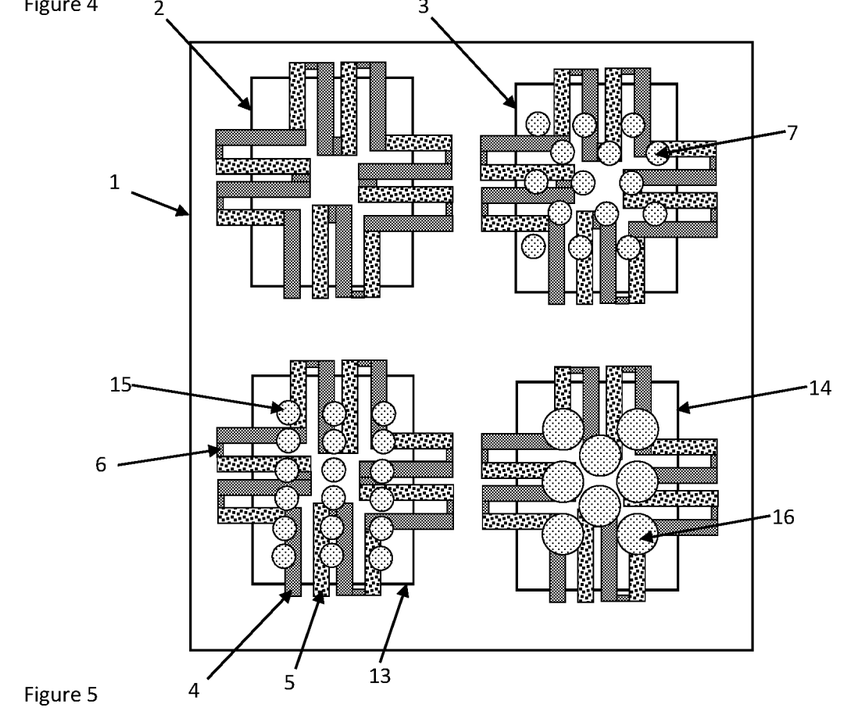
FIG. 5 shows a schematic top view of a thermopile IR detector chip comprising four thermopile IR detectors. Three of the four thermopile IR detectors have a patterned layer for controlling the IR absorption. The patterned plasmonic layers are different on each device.

FIG. 5 shows a schematic top-view of a thermopile IR detector chip 1, with four membranes 2, 3, 13 and 14. The membranes are dielectric membranes and may comprise one or more layers of silicon dioxide and/or silicon nitride. A thermopile, comprising one or more thermocouples connected in series, is embedded within each membrane to form four distinct thermopile IR detectors. Each thermocouple comprises two dissimilar materials 4 and 5 which form a junction within the membrane while the other ends of the materials are outside the membrane where they are connected electrically to the adjacent thermocouple to form the cold junction. The thermocouple materials may comprise metal such as Aluminium, Tungsten, Titanium or combination of those, doped polysilicon (n or p type) or doped single crystal silicon (n or p type). In the example that both the materials are polysilicon and/or single crystal silicon, a metal link 6 might be used to form the junctions between them. A plasmonic patterned layer 7 is also embedded within membrane 3, to provide the thermopile IR detector with tailored optical properties. A plasmonic patterned layers 15 and 16 is also embedded within membrane 13 and 14, to provide the thermopile IR detectors with tailored optical properties different from each other and from the ones provided by layer 7. Alternatively, the patterned plasmonic layer may be identical in all the IR devices within the array. Alternately, the patterned plasmonic layer or layers may be different on each device, or may be the same across some devices, but different across others. The array may also have some devices with the same patterned plasmonic layer or layers and some without any patterned plasmonic layer.

Figure 6:
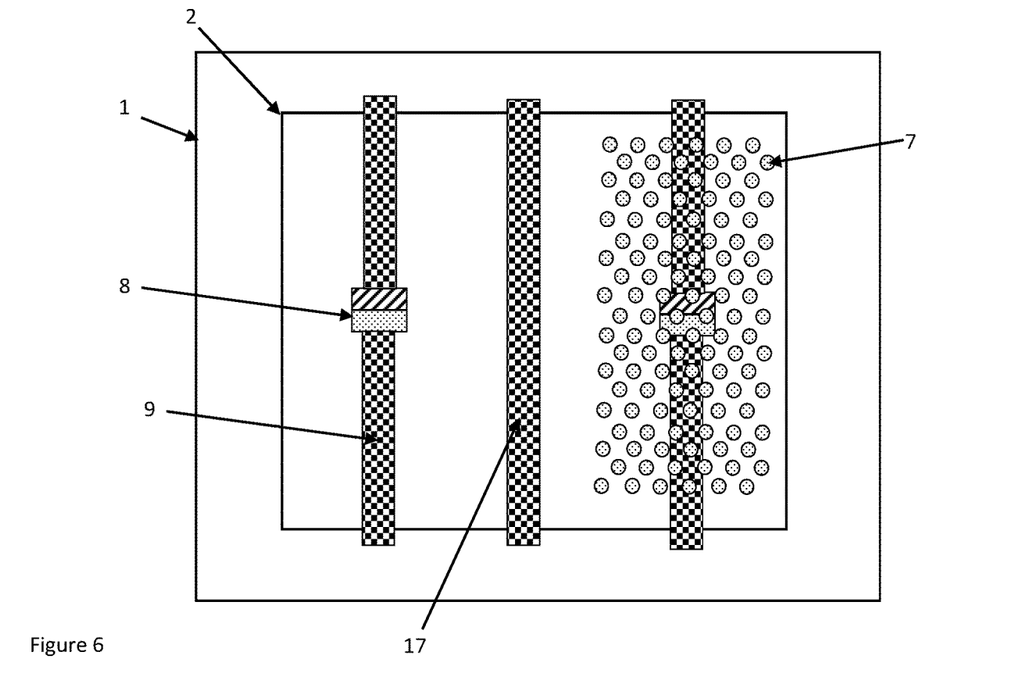
FIG. 6 shows a schematic top view of a double diode IR detector chip, with one IR detector having a patterned layer for controlling the IR absorption. The diodes are embedded within the same dielectric membrane and along with multiple metal tracks acting as separation.

FIG. 6 shows a schematic top-view of a double diode IR detector chip 1, with a single membrane 2. The membrane is dielectric membrane and may comprise one or more layers of silicon dioxide and/or silicon nitride. Two diode 8, and tracks 9, are embedded within the membrane along with a separation 17 to form to diode IR detectors. The diodes may be made of polysilicon or of single crystal silicon. One or several diodes for enhanced sensitivity may be connected in series in the centre or in the proximity of the centre of the membrane. A plasmonic patterned layer 7 is also embedded within membrane 2, to provide only one of the diodes IR detectors with tailored optical properties.

Figure 7:
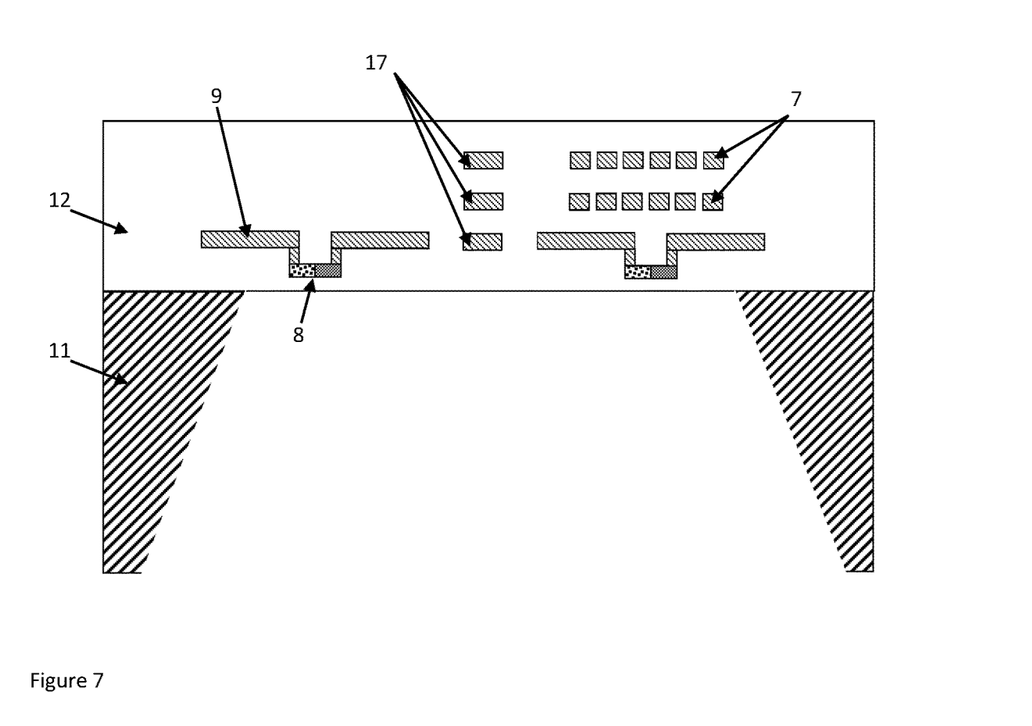
FIG. 7 shows the schematic cross-section of the double diode IR detector chip shown in FIG. 6 where the membrane trench has sloping side-walls.

FIG. 7 shows the schematic cross-section of the double diode IR detector chip shown in FIG. 6. The membranes 2 are supported on an etched substrate 11, and comprise dielectric layers 12 and may comprise one or more layers of silicon dioxide and/or silicon nitride. The diodes 8 are made of single crystal silicon and contacted via metal tracks 9. Alternatively, the diodes may be made of polysilicon. A plasmonic patterned layer 7, made of multiple metal layers, is also embedded within membrane 2, to provide only one of the diode IR detectors with tailored optical properties. Metal layers 17 are used to form the separation between the diodes. This separation area also acts as a heat sink. The separation 17, while made of metal in this figure, may also be made from single crystal silicon or polysilicon, or may comprise metal and polysilicon and/or single crystal silicon. The substrate in this example is etched by KOH resulting in sloping sidewalls.

Figure 8:
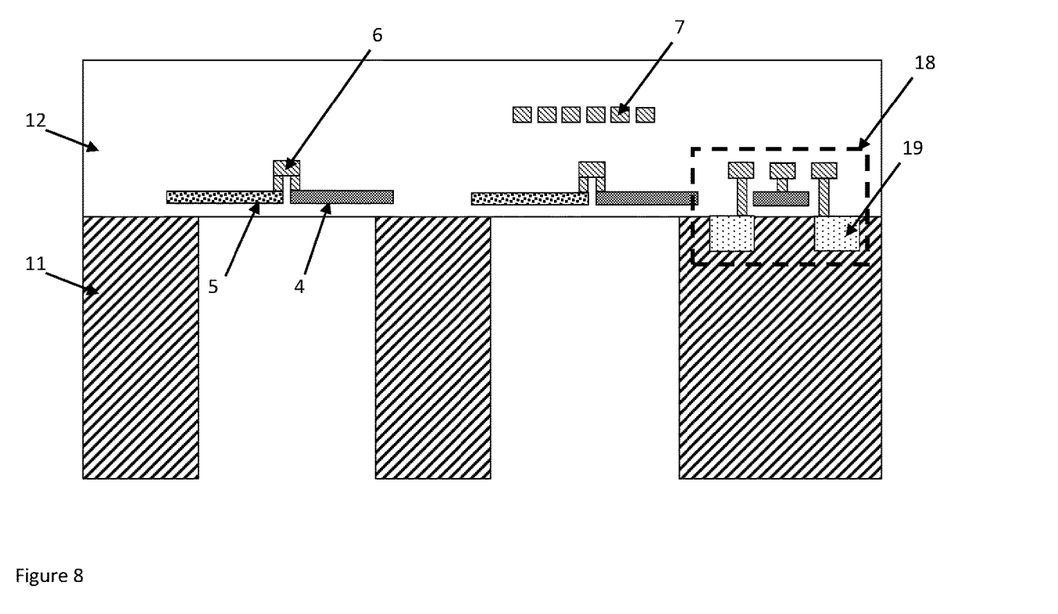
FIG. 8 shows the schematic cross section of the double thermopile IR detector chip with circuitry on the same chip.

FIG. 8 shows the schematic cross-section of the double thermopile IR detector chip shown in FIG. 1 with circuitry on the same chip. The membranes 2 and 3 are supported on an etched substrate 11, and comprise dielectric layers 12 and may comprise one or more layers of silicon dioxide and/or silicon nitride. The thermopiles comprise p-doped silicon 4, and n-doped silicon 5, and a metal 6 is used to form a junction between them. The thermopile materials may comprise many other configurations, for example, n-doped silicon and metal or p-doped silicon and metal. The silicon for the thermopiles may be polysilicon or single crystal silicon. A plasmonic patterned layer 7 is also embedded within membrane 3, to provide the thermopile IR detector with tailored optical properties. The substrate in this example is etched by Deep Reactive Ion Etching (DRIE) which results in vertical sidewalls. Outside the membrane areas, as an example, a MOSFET 18 is shown, which comprises implant regions 19, a polysilicon gate and interconnect metal.

Figure 9:
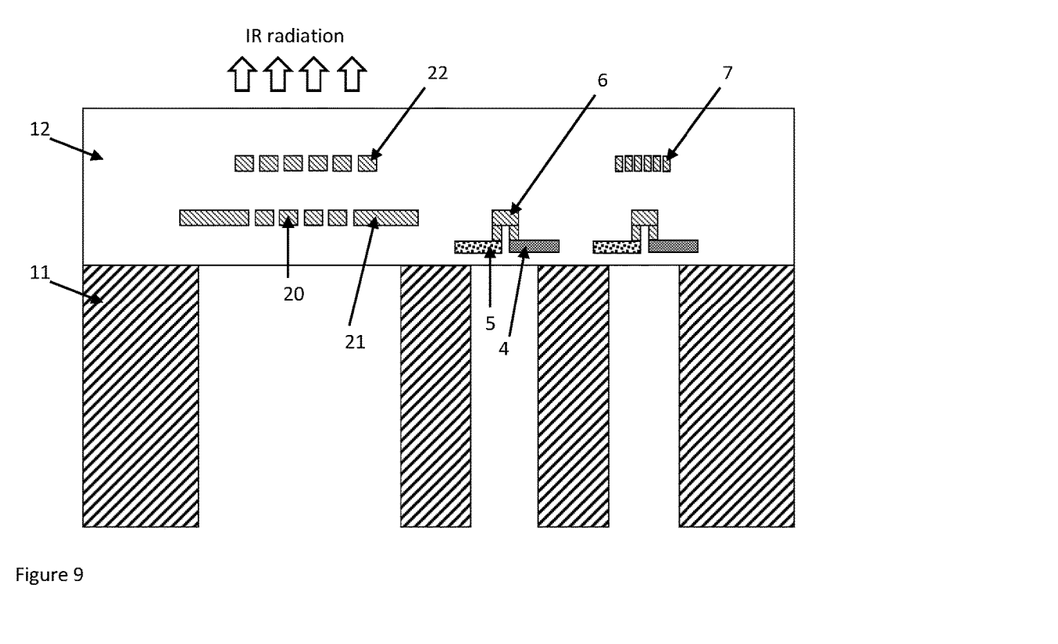
FIG. 9 shows the schematic cross section of the double thermopile IR detector chip having an IR emitter fabricated on the same chip.

FIG. 9 shows the schematic cross-section of the double thermopile IR detector chip shown in FIG. 1 with an IR emitter on the same chip. The membranes 2 and 3 are supported on an etched substrate 11, and comprise dielectric layers 12 and may comprise one or more layers of silicon dioxide and/or silicon nitride. The thermopiles comprise p-doped silicon 4, and n-doped silicon 5, and a metal 6 is used to form a junction between them. The thermopile materials may comprise many other configurations, for example, n-doped silicon and metal, or p-doped silicon and metal. The silicon for the thermopiles may be polysilicon or single crystal silicon. A plasmonic patterned layer 7 is also embedded within membrane 3, to provide the thermopile IR detector with tailored optical properties. The substrate in this example is etched by Deep Reactive Ion Etching (DRIE) which results in vertical sidewalls. An IR emitter, in form of a microheater 20, is connected via tracks 21 and embedded within an additional membrane. A plasmonic patterned layer 22 is also embedded within the IR emitter membrane to provide the IR emitter with tailored optical properties.

Figure 10:
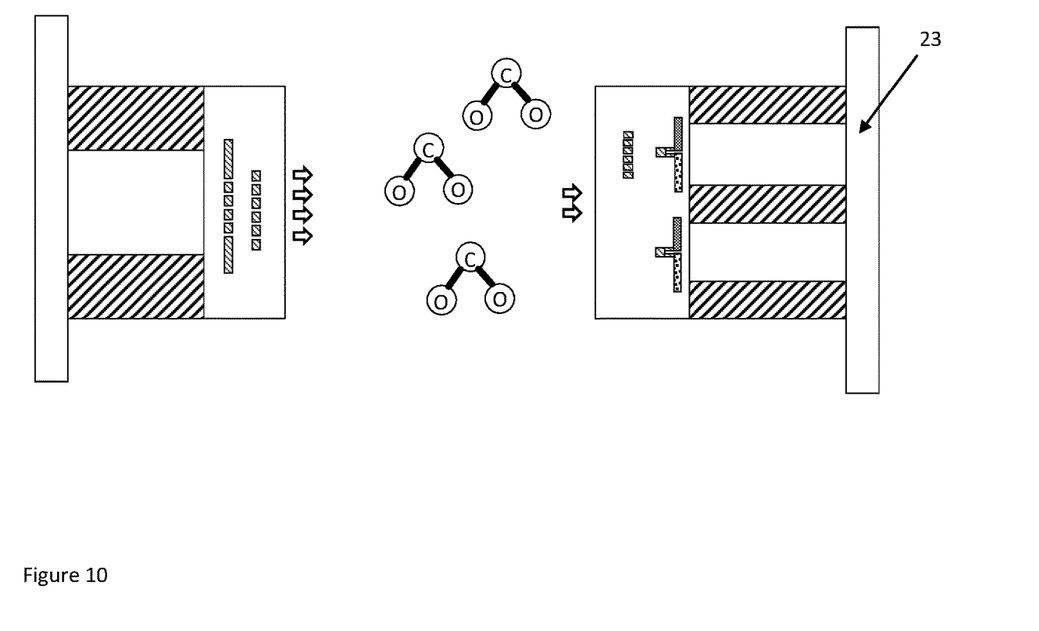
FIG. 10 shows a schematic depiction of the double thermopile IR detector chip facing an IR emitter for filter-less carbon dioxide NDIR detection.

FIG. 10 shows a schematic depiction of a double thermopile IR detector chip facing an IR emitter for filter-less carbon dioxide NDIR detection. The chips are both mounted on a package 23. The devices maybe packaged in a metal TO type package. The devices may also be packaged in a ceramic, metal or plastic SMD (surface mount device) package. The package may have one or more IR filters or windows, or a filter whose characteristics vary spatially. The package maybe hermetically or semi-hermetically sealed with air, dry air, argon, nitrogen, xenon or any other noble gas. The device may also be packaged in a vacuum. The device may also be packaged with a lens or a reflector. The package may also be a chip or wafer level package, formed for example, by wafer-bonding an etched wafer/chip on top, with the etched wafer/chip having a portion that is transparent to at least some wavelengths of IR. The device may also be packaged directly on a PCB, or be packaged in a flip-chip method. Even if in this example the NDIR system is for carbon dioxide detection, it may be used for detecting other gases (e.g. carbon monoxide, humidity, methane, etc.).

Figure 11:
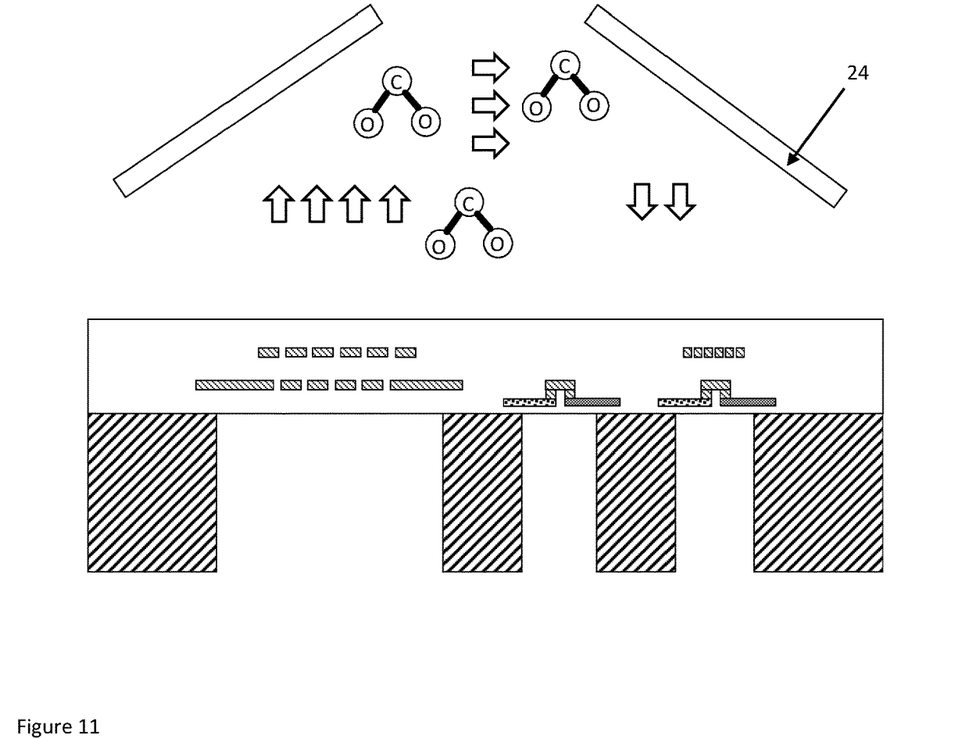
FIG. 11 shows a schematic depiction of a double thermopile IR detector chip having an IR emitter fabricated on the same chip for filter-less carbon dioxide NDIR detection.

FIG. 11 shows a schematic depiction of a double thermopile IR detector chip having an IR emitter fabricated on the same chip for filter-less carbon dioxide NDIR detection. The device maybe packaged in a metal transistor output (TO) type package. The device may also be packaged in a ceramic, metal or plastic SMD (surface mount device) package. The package may have one or more IR filters or windows, or a filter whose characteristics vary spatially. The package maybe hermetically or semi-hermetically sealed with air, dry air, argon, nitrogen, xenon or any other noble gas. The device may also be packaged in a vacuum. The device may also be packaged with a lens or a reflector. The package may also be a chip or wafer level package, formed for example, by wafer-bonding an etched wafer/chip on top, with the etched wafer/chip having a portion that is transparent to at least some wavelengths of IR. The device may also be packaged directly on a PCB, or be packaged in a flip-chip method. Even if in this example the NDIR system is for carbon dioxide detection, it may be used for detecting other gases (e.g. carbon monoxide, humidity, methane, etc.). The IR radiation is guided from the IR emitter to the IR detector via mirrors 24. Other methods for guiding the IR radiation from the IR emitter to the IR detector may be employed.

Figure 12:
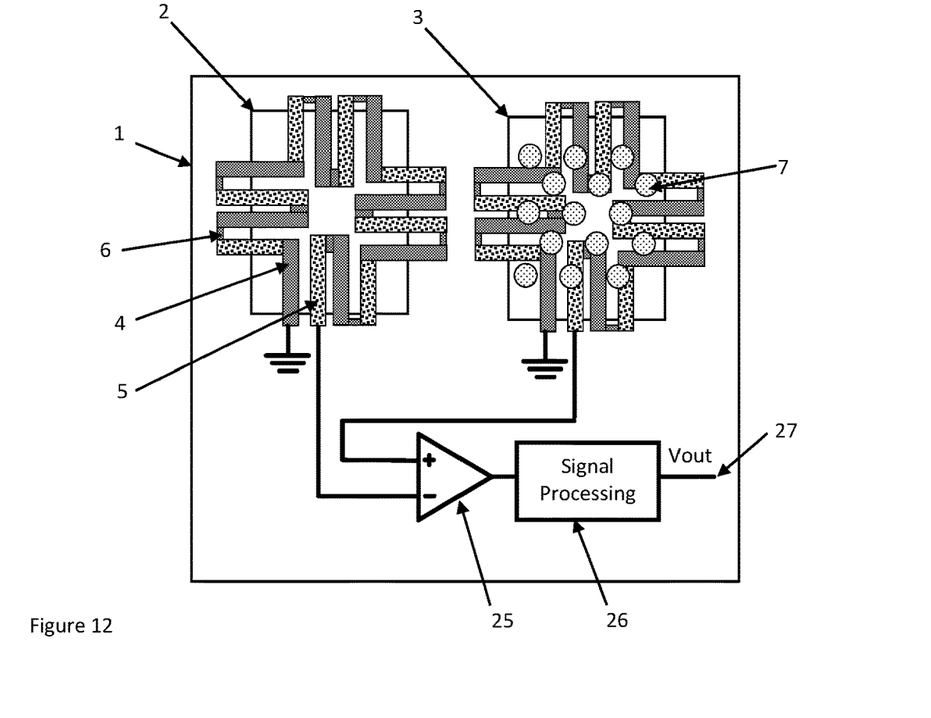
FIG. 12 shows a schematic top view of a double thermopile IR detector chip with circuitry on the same chip.

FIG. 12 shows a schematic top-view of a double thermopile IR detector chip 1, with two membranes 2 and 3. The membranes are dielectric membranes and may comprise one or more layers of silicon dioxide and/or silicon nitride. A thermopile, comprising one or more thermocouples connected in series, is embedded within each membrane to form two distinct thermopile IR detectors. Each thermocouple comprises two dissimilar materials 4 and 5 which form a junction within the membrane while the other ends of the materials are outside the membrane where they are connected electrically to the adjacent thermocouple to form the cold junction. The thermocouple materials may comprise metal such as Aluminium, Tungsten, Titanium or combination of those, doped polysilicon (n or p type) or doped single crystal silicon (n or p type). In the example that both the materials are polysilicon and/or single crystal silicon, a metal link 6 might be used to form the junctions between them. A plasmonic patterned layer 7 is also embedded within membrane 3, to provide the thermopile IR detector with tailored optical properties. As an example, a differential amplifier 25 and circuitry for signal processing 26 are co-integrated on the same chip to provide the double thermopile IR detector chip with a single output 27, thus facilitating the integration of the chip in a system and improving the chip performance by reducing parasitic components arising from the implementation of such circuitry on a separate chip or PCB.

Figure 13:
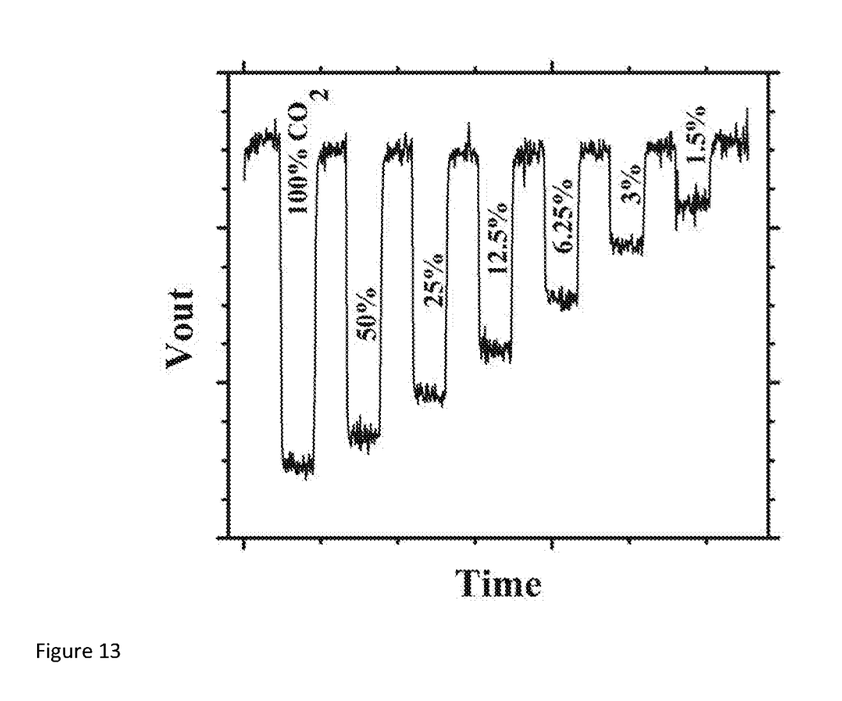
FIG. 13 shows the carbon dioxide detection capabilities of the chip depicted in FIG. 12 in the NDIR configuration depicted in FIG. 10.

FIG. 13 shows the carbon dioxide detection capabilities of a chip similar to the one depicted in FIG. 12 in the NDIR configuration similar to the one depicted in FIG. 10.

Figure 14:
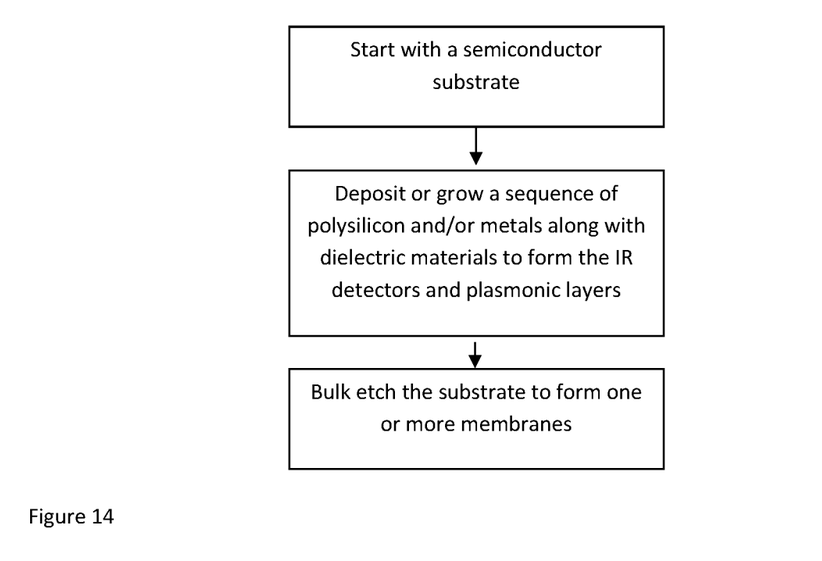
FIG. 14 illustrates an exemplary flow diagram outlining the manufacturing method of the IR detector array device.

FIG. 14 illustrates an exemplary flow diagram outlining the manufacturing method of the IR detector array device.

The skilled person will understand that in the preceding description and appended claims, positional terms such as 'above', 'overlap', 'under', 'lateral', etc. are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above may be reversed, the resulting devices still being in accordance with embodiments of the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. An infra-red (IR) detector array device comprising:
   a dielectric layer formed on a semiconductor substrate comprising an etched portion;
   at least one dielectric membrane formed within the dielectric layer, wherein the at least one dielectric membrane is adjacent to the etched portion of the semiconductor substrate;
   an array of IR detectors comprising at least two IR detectors, wherein said array of IR detectors are formed on or within said at least one dielectric membrane, and wherein at least two IR detectors of the array of IR detectors are formed within a single dielectric membrane of the at least one dielectric membrane; and
   at least one patterned layer formed within or on said dielectric membrane for controlling the IR absorption of at least one of the said IR detectors, and
   wherein said at least one patterned layer comprises laterally spaced structures, and wherein said at least one patterned layer comprises a first set of laterally spaced structures above one of the IR detectors and a second set of laterally spaced structures above one other of the IR detectors, wherein the first and second sets of laterally spaced structures have a different pattern.

2. A device according to claim 1, wherein said at least one patterned layer is located above one of the at least two IR detectors so that said at least one patterned layer is associated with one of the at least two IR detectors.

3. A device according to claim 1, wherein said at least one patterned layer is located above all the IR detectors within the dielectric membrane so that said at least one patterned layer is associated with all of the at least two IR detectors.

4. A device according to claim 1, wherein said at least one patterned layer having the laterally spaced structures have the same pattern above at least some of the IR detectors.

5. A device according to claim 1, wherein said at least one patterned layer having the laterally spaced structures have a different pattern above at least some of the IR detectors.

6. A device according to claim 1, wherein each laterally spaced structure comprises a metal comprising gold or platinum, or a CMOS-based metal such as aluminium, copper, titanium, molybdenum, or tungsten.

7. A device according to claim 1, wherein said structures are repeated periodically in a lateral direction forming a repeat pattern.

8. A device according to claim 7, wherein the repeat pattern comprises a hexagonal or square shape.

9. A device according to claim 1, wherein said structures comprise a circle, ellipse, rectangular, trapezoid or a combination of different shapes, or a hole of these shapes within a layer.

10. A device according to claim 1, wherein the patterned layer comprises single crystal silicon or polysilicon.

11. A device according to claim 1, wherein the IR detectors comprise any one or more of a thermopile, a resistor, transistor and a diode.

12. A device according to claim 1, wherein each IR detector comprises a thermopile comprising one or more thermocouples each coupled in series.

13. A device according to claim 12, wherein each thermocouple further comprises a first thermal junction, joins to adjacent thermocouples to form a second thermal junctions, the first thermal junction being a hot junction and the second thermal junction being a cold junction.

14. A device according to claim 13, wherein the hot junction is located inside the dielectric membrane and the cold junction is located outside the dielectric membrane.

15. A device according to claim 1, wherein each IR detector comprises at least one diode, wherein said at least one diode comprises a material comprising polysilicon or single crystal silicon.

16. A device according to claim 15, further comprising a reference diode in the cold junction region to measure substrate or ambient temperature.

17. A device according to claim 1, wherein each IR detector comprises at least one resistor, wherein said at least one resistor is located in the centre of the dielectric membrane.

18. A device according to claim 17, wherein said at least one resistor comprises a material comprising:
   metal comprising aluminium, tungsten, copper, titanium, and/or platinum;
   n or p type polysilicon; and
   n or p type single crystal silicon.

19. A device according to claim 18, further comprising a reference resistor located in the cold junction region to measure substrate or ambient temperature.

20. A device according to claim 1, wherein each IR detector comprises a thermopile in which Seeback effect and resistance change effect are used to determine IR radiation.

21. A device according to claim 1, wherein each comprises a thermopile coupled with a reference diode in the cold junction region to determine a cold junction temperature estimation which is used to determine an absolute hot junction temperature.

22. A device according to claim 1, wherein the dielectric membrane comprises silicon dioxide and/or silicon nitride.

23. A device according to claim 1, wherein all the IR detectors of the array are formed within or on a single membrane.

24. A device according to claim 1, further comprising a plurality of dielectric membranes each comprising a plurality of IR detectors.

25. A device according to claim 1, wherein said at least one dielectric membrane further comprises further structures comprising polysilicon, single crystal silicon or metal, the further structures separating the IR detectors.

26. A device according to claim 25, wherein said further structures are embedded within, above and/or below the dielectric membrane.

27. A device according to claim 1, wherein said at least one dielectric membrane is formed by any one of:
    back-etching using Deep Reactive Ion Etching (DRIE) of the substrate, which results in vertical sidewalls; and
    using anisotropic etching such as KOH (Potassium Hydroxide) or TMAH (Tetra Methyl Ammonium Hydroxide) which results in slopping sidewalls.

28. A device according to claim 1, wherein said at least one dielectric membrane is formed by a front-side etch or a combination of a front-side and back-side etch to result in a suspended membrane structure, supported only by two or more beams.

29. A device according to claim 1, wherein said at least one dielectric membrane is circular.

30. A device according to claim 1, wherein said at least one dielectric membrane is rectangular, or rectangular shaped with rounded corners to reduce the stresses in the corners.

31. A device according to claim 1, being formed with circuitry in the same package.

32. A device according to claim 1, wherein the substrate comprises any one of:
    silicon;
    silicon on insulator;
    silicon carbide;
    gallium arsenide;
    gallium nitride; and/or
    a combination of silicon carbide, gallium arsenide, gallium nitride with silicon.

33. A device according to claim 1, wherein the device is fabricated using a CMOS-usable metal selected from a group comprising tungsten, aluminium, titanium, and molybdenum.

34. A device according to claim 1, wherein the IR detectors are formed using a CMOS-usable material selected from a group comprising Silicon, polysilicon and silicides.

35. A device according to claim 1, wherein the device is fabricated using a non-CMOS material.

36. A device according to claim 1, wherein the device is packaged using one or more of:
    a metal transistor output (TO) type package;
    a ceramic, metal or plastic surface mount package;
    IR filters;
    a reflector;
    a flip-chip method;
    a chip or wafer level package;
    a lens;
    a printed circuity board (PCB).

37. A device according to claim 36, wherein the package is hermetically or semi-hermetically sealed with air, dry air, argon, nitrogen, xenon or any other noble gas; and/or the device is packaged in vacuum.

38. A method of manufacturing an infra-red (IR) detector array device, the method comprising:
    forming a semiconductor substrate;
    depositing one or more layers of polysilicon and/or metals and dielectric layers to form an array of IR detectors and at least one patterned layer;
    bulk etching the semiconductor substrate to form one or more dielectric membranes within the dielectric layers, wherein the one or more dielectric membranes are adjacent to an etched portion of the semiconductor substrate, and wherein at least two IR detectors of the array of IR detectors are formed within a single dielectric membrane of the one or more dielectric membranes;
    wherein said at least one patterned layer is formed within or on said dielectric membrane for controlling the IR absorption of at least one of the said IR detectors, and
    wherein said at least one patterned layer comprises laterally spaced structures, and
    wherein said at least one patterned layer comprises a first set of laterally spaced structures above one of the IR detectors and a second set of laterally spaced structures above one other of the IR detectors, wherein the first and second sets of laterally spaced structures have a different pattern.

* * * * *